(12) United States Patent
Itaya et al.

(10) Patent No.: US 7,709,999 B2
(45) Date of Patent: May 4, 2010

(54) THIN FILM PIEZOELECTRIC RESONATOR AND METHOD OF MANUFACTURING THE SAME

(75) Inventors: Kazuhiko Itaya, Yokohama (JP); Ryoichi Ohara, Kawasaki (JP); Kenya Sano, Kawasaki (JP); Takaaki Yasumoto, Kanagawa (JP); Naoko Yanase, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 982 days.

(21) Appl. No.: 10/582,229

(22) PCT Filed: Mar. 29, 2006

(86) PCT No.: PCT/JP2006/007155

§ 371 (c)(1),
(2), (4) Date: Jun. 9, 2006

(87) PCT Pub. No.: WO2007/017974

PCT Pub. Date: Feb. 15, 2007

(65) Prior Publication Data

US 2009/0033177 A1      Feb. 5, 2009

(30) Foreign Application Priority Data

Aug. 8, 2005 (JP) ............................. 2005-229815

(51) Int. Cl.
*H01L 41/047* (2006.01)
(52) U.S. Cl. ..................... 310/320; 310/365
(58) Field of Classification Search ............. 310/320, 310/365
See application file for complete search history.

(56) References Cited

U.S. PATENT DOCUMENTS

| 6,150,703 | A | 11/2000 | Cushman et al. |
| 6,476,536 | B1* | 11/2002 | Pensala ................... 310/312 |
| 6,812,619 | B1 | 11/2004 | Kaitila et al. |
| 7,382,078 | B2* | 6/2008 | Bradley .................. 310/320 |
| 7,463,117 | B2* | 12/2008 | Ohara et al. ............. 333/187 |
| 7,498,904 | B2* | 3/2009 | Ohara et al. ............. 333/189 |
| 7,501,739 | B2* | 3/2009 | Itaya et al. .............. 310/320 |
| 7,535,154 | B2* | 5/2009 | Umeda et al. ............ 310/320 |

(Continued)

FOREIGN PATENT DOCUMENTS

JP       2000-069594       3/2000

(Continued)

OTHER PUBLICATIONS

Thalhammer, Robert et al.,"Prediction of BAW Resonator Performance Using Experimental and Numerical Methods", Ultrasonics Symposium, pp. 282-285, 2004.

(Continued)

*Primary Examiner*—Thomas M Dougherty
(74) *Attorney, Agent, or Firm*—Oblon, Spivak, McClelland, Maier & Neustadt, L.L.P.

(57) ABSTRACT

A thin film piezoelectric resonator includes a substrate having a cavity; a first electrode extending over the cavity; a piezoelectric film placed on the first electrode; and a second electrode placed on the piezoelectric film, the second electrode having a periphery partially overlapping on the cavity and tapered to have an inner angle of 30 degrees or smaller defined by a part of the periphery thereof and a bottom thereof.

16 Claims, 8 Drawing Sheets

U.S. PATENT DOCUMENTS

| | | | |
|---|---|---|---|
| 2002/0190814 A1 | 12/2002 | Yamada et al. | |
| 2004/0263287 A1 | 12/2004 | Ginsburg et al. | |
| 2008/0284542 A1* | 11/2008 | Sano et al. | 333/187 |
| 2008/0297006 A1* | 12/2008 | Wijngaards et al. | 310/365 |

FOREIGN PATENT DOCUMENTS

| | | |
|---|---|---|
| JP | 2003-505905 A | 2/2003 |
| JP | 2004-64785 A | 2/2004 |
| JP | 2005-45694 A | 2/2005 |
| JP | 2005-57707 A | 3/2005 |
| WO | 01 06647 | 1/2001 |

OTHER PUBLICATIONS

Aigner, Robert et al.,"Bulk-Acoustic-Wave Filters: Performance Optimization and Volume Manufacturing", International Microwave Symposium Digest., vol. 3, pp. 2001-2004, 2003.

U.S. Appl. No. 11/447,999, filed Jun. 7, 2006, Ohara et al.

U.S. Appl. No. 11/761,767, filed Jun. 12, 2007, Sano et al.

* cited by examiner

THIN FILM PIEZOELECTRIC RESONATOR AND METHOD OF MANUFACTURING THE SAME

TECHNICAL FILED

This invention relates to a thin film piezoelectric resonator and a method of manufacturing the same, and more particularly relates to a thin film piezoelectric resonator which uses axial vibrations in a direction of the thickness of a thin piezoelectric film, and the method of manufacturing such a thin film piezoelectric resonator.

BACKGROUND ART

Along with a remarkable breakthrough in the field of wireless communications, a variety of developments have been in progress in order to accelerate information transmission. With the wireless communications, frequency bands of approximately 2 GHz are in wide use in order to cope with the introduction of PHS systems, third generation cellular phones, wireless LAN, and so on. Further, the number of users and wireless terminals are extensively increased. The higher the information transmission speeds, the higher the carrier frequencies. Wireless LAN systems operating on a 5 GHz frequency band are now in business use.

There are strong demands on miniaturization of communication devices operating on high frequency bands. Especially, with a personal computer (PC), a communication device is realized by a PC card which should be as thin as approximately several millimeters.

Generally, a wireless communication device in the shape of the PC card includes an RF front end which processes radio frequencies, and a base band (BB) unit which processes digital signals. The base band unit is preferably an LSI chip made of a silicon (Si) substrate, and can be thinned to 1 mm or less.

The RF front end amplifies and coverts high frequencies as analog signals, and includes a number of passive components such as oscillators and filters. It is technically difficult to constitute the RF front end only by an LSI chip because the RF front end has a very complicated structure. The filters are either dielectrics or LC filters. The filters can filter high frequency signals using passband characteristics of a cavity resonator or an LC circuit, and is essentially difficult to be downsized and to be thinned to several millimeters or less. In other words, communication devices operating on high frequency bands have limitations on their miniaturization.

In order to overcome the foregoing problem, Japanese Patent Laid-Open Publication No. 2000-069,594 proposes a film bulk acoustic wave resonator (FBAR) which has attracted attentions, for example. In the FBAR, a thin piezoelectric film made of aluminum nitride (AlN) or zinc oxide is sandwiched between lower and upper electrodes. The thin piezoelectric film is placed over a cavity in a substrate. The resonator lets frequencies resonate along the thickness of not only the lower and upper electrodes which are in contact with an air layer but also the piezoelectric film. The foregoing thickness of 0.5 μm to several μm which can be accomplished by a film making process is suitable to frequencies of several GHz. Therefore, resonators compatible with high frequencies in GHz bands can be easily manufactured.

For instance, two thin film piezoelectric resonators are connected in series, and one thin film piezoelectric resonator is connected in parallel with the two thin film piezoelectric resonators, thereby obtaining a ladder-shaped filter. With a passband filter, the central frequency of the series-connected this film piezoelectric resonators and that of the parallel-connected thin film piezoelectric resonator are slightly different. Therefore, the resonance frequency of the parallel-connected thin film piezoelectric resonator is adjusted to be equal to that of the series-connected thin film piezoelectric resonators, for instance.

The foregoing thin film piezoelectric resonator can be produced using the film making process which is used to form a thin film on a substrate, and can be miniaturized. Especially, a general purpose filter can be easily made as thin as 1 mm or less, which is usually very difficult. Further, the substrate may be made of Si, which enables the thin film piezoelectric resonator to be produced by a semiconductor manufacturing process. Still further, the thin film piezoelectric resonator is reliably compatible with a transistor, IC, LSI and so on, and can have them mounted thereon.

However, there are the following new problems when a high frequency module is made using the thin film piezoelectric resonator on which a transistor, IC, LSI and so on are mounted.

The thin film piezoelectric resonator operates on bulk standing waves which are generated in a direction extending along the thickness of the piezoelectric film and produces resonance. However, lateral mode standing waves are generated at an edge of an electrode and an edge of a piezoelectric film. Such lateral mode standing waves have specific values. As a result, a lateral mode standing wave is generated. A wavelength of the lateral mode standing wave differs from that of the bulk wave. When combined with the bulk wave, the lateral mode standing wave causes a variety of parasitic vibration modes (spurious vibrations). If spurious vibrations are caused, ripples are generated, which fluctuate high frequency signal characteristics (Smith chart). This phenomenon extensively deteriorates resonance performance of the thin film piezoelectric resonator, or makes the resonance performance variable.

Figure 14:
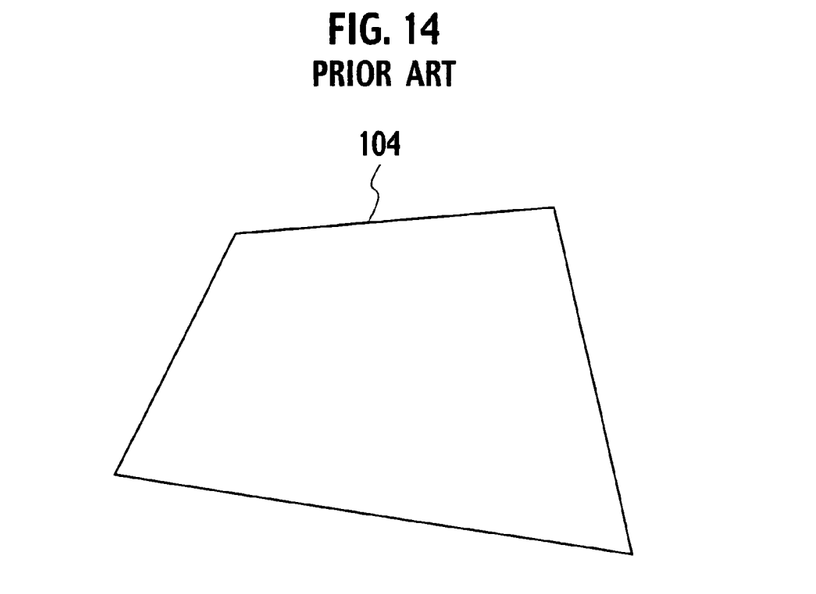
FIG. 14 shows a contour of an upper electrode in a thin film piezoelectric resonator in the related art.

In order to overcome the foregoing problem, it has been proposed to suppress the lateral mode standing wave by making a contour of an upper electrode of a thin film piezoelectric resonator in the shape of an irregular polygon, as shown in FIG. 14 of the accompanying drawings. However, since such an upper electrode 104 becomes large, it is impossible to miniaturize a filter including thin film piezoelectric resonators.

Figure 15:
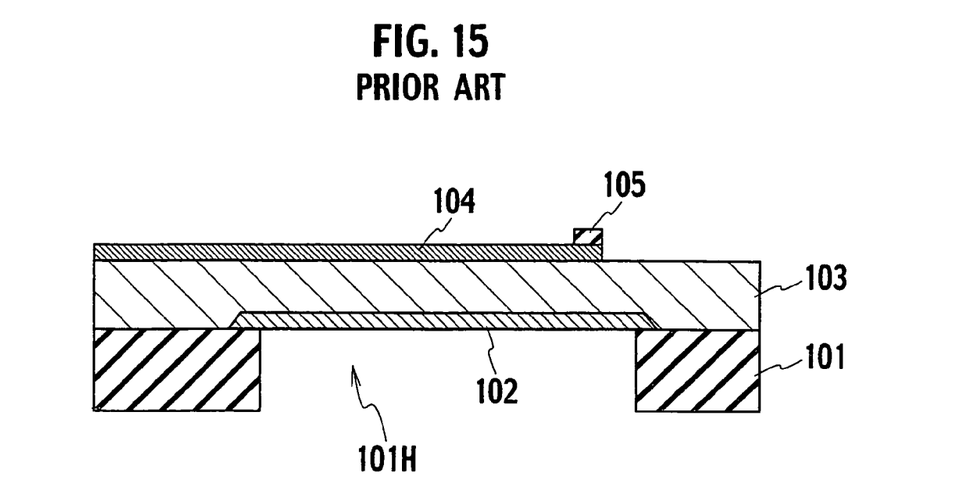
FIG. 15 is a cross section of the thin film piezoelectric resonator of FIG. 14, taken along line F14-F14 in FIG. 16.
Figure 16:
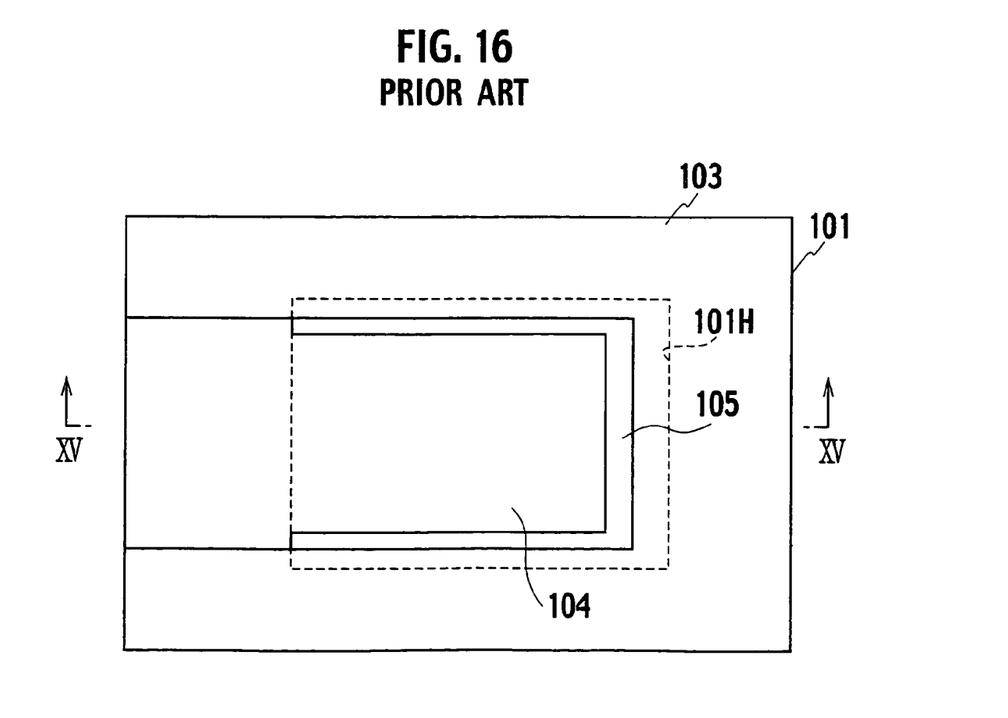
FIG. 16 is a top plan view of the thin film piezoelectric resonator of FIG. 15.

Referring to FIG. 15 and FIG. 16, a thin film piezoelectric resonator 100 includes an upper electrode 104, a substrate 101 having a cavity 101H, a lower electrode 102 extending over the cavity 101H, and a thin piezoelectric film 103 on the lower electrode 102. The upper electrode 104 is present over the piezoelectric film 103, and has a damping layer 105 at its one end. The damping layer 105 damps the lateral mode standing wave. However, a new process for making the damping layer 105 should be added to a process for making the thin film piezoelectric resonator 100. This not only increases the number of manufacturing processes but also reduces an yield of the thin film piezoelectric resonator 100. Further, the damping layer 105 should be aligned with the edge of the upper electrode 104. However, a sufficient processing margin cannot be secured.

DISCLOSURE OF INVENTION

The invention is aimed at providing a thin film piezoelectric resonator which can overcome the foregoing problems of the related art, improve resonating performance thereof, and be miniaturized.

Further, the invention is aimed at providing a method of manufacturing the thin film piezoelectric resonator which can reduce the number of manufacturing steps, improve the yield, and secure a sufficient processing margin.

A first aspect of the embodiment of the invention relates to a thin film piezoelectric resonator which includes a substrate having a cavity; a first electrode extending over the cavity; a piezoelectric film placed on the first electrode; and a second electrode placed on the piezoelectric film. The second electrode has a part of a periphery which overlaps on the cavity, is tapered, and has an inner angle of 30 degrees or smaller defined by a part of the periphery thereof and a bottom thereof.

A second aspect of the embodiment of the invention relates to a thin film piezoelectric resonator includes a substrate having a cavity; a first electrode extending over the cavity; a piezoelectric film placed on the first electrode; a second electrode placed on the piezoelectric film and having a part of a periphery thereof which overlaps on the cavity; and an insulator placed on the second electrode and the piezoelectric film where the second electrode is absent, and being thin on the center and thick on the periphery of the second electrode.

A third aspect of the embodiment of the invention relates to a thin film piezoelectric resonator includes a substrate having a cavity; a first electrode extending over the cavity; a piezoelectric film placed on the first electrode; a second electrode placed on the piezoelectric film and having a periphery which overlaps on the cavity, is tapered, and has an inner angle of 30 degrees or smaller defined by a part of the periphery thereof and a bottom thereof; and an insulator placed on the second electrode and the piezoelectric film where the second electrode is absent, and being thin on the center of the second electrode and thick on the periphery of the second electrode.

A fourth aspect of the embodiment of the invention relates to a thin film piezoelectric resonator includes a substrate having a cavity; a first electrode extending over the cavity; a piezoelectric film placed on the first electrode; a second electrode placed on the piezoelectric film and having a periphery which overlaps on the cavity, and an insulator placed on the second electrode and the piezoelectric film where the second electrode is absent, and having the thickness varying on the piezoelectric film and on the periphery of the second electrode.

A fifth aspect of the embodiment of the invention relates to a thin film piezoelectric resonator includes a substrate having a cavity; a first electrode extending over the cavity; a piezoelectric film placed on the first electrode; a second electrode placed on the piezoelectric film and having a periphery which overlaps on the cavity; and an insulator placed on the second electrode and the piezoelectric film where the second electrode is absent and having the thickness gradually varying on the piezoelectric film and on the periphery of the second electrode.

A final aspect of the embodiment of the invention relates to a method of manufacturing a thin film piezoelectric resonator. The method includes making a cavity in a substrate; making a first electrode over the cavity; making a piezoelectric film on the first electrode; making an electrode forming layer on the piezoelectric film; making a photo-resist layer on the electrode forming layer, the photo-resist layer overlapping on the cavity; tapering an edge of the photo-resist layer, the tapered photo-resist layer having an acute angle and serving as a mask; and patterning the electrode layer using the mask in order to make a second electrode, and transferring a shape of the tapered edge of the mask onto an end of the second electrode, the tapered edge of the second electrode having an acute inner angle.

BRIEF DESCRIPTION OF DRAWINGS

FIG. 6 is a cross section showing how the thin film piezoelectric resonator of FIG. 1 and FIG. 2 is made in a first manufacturing process;

BEST MODE FOR CARRYING OUT THE INVENTION

First Embodiment

[Configuration of Thin Film Piezoelectric Resonator]

Figure 1:
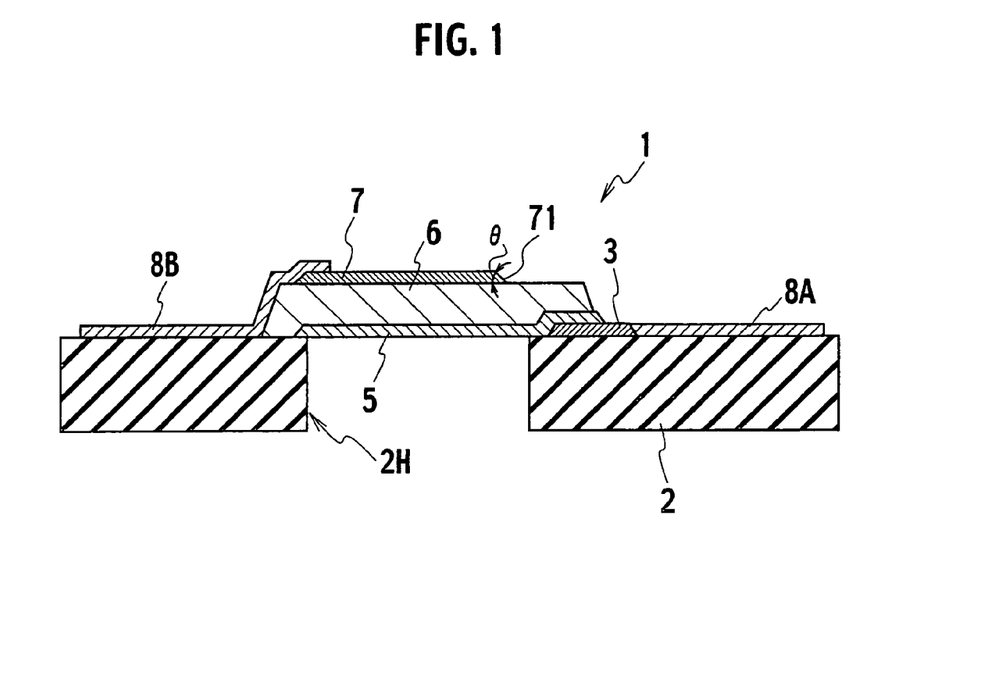
FIG. 1 is a cross section of a thin film piezoelectric resonator according to a first embodiment of the invention, taken along line F1-F1 shown in FIG. 2.
Figure 2:
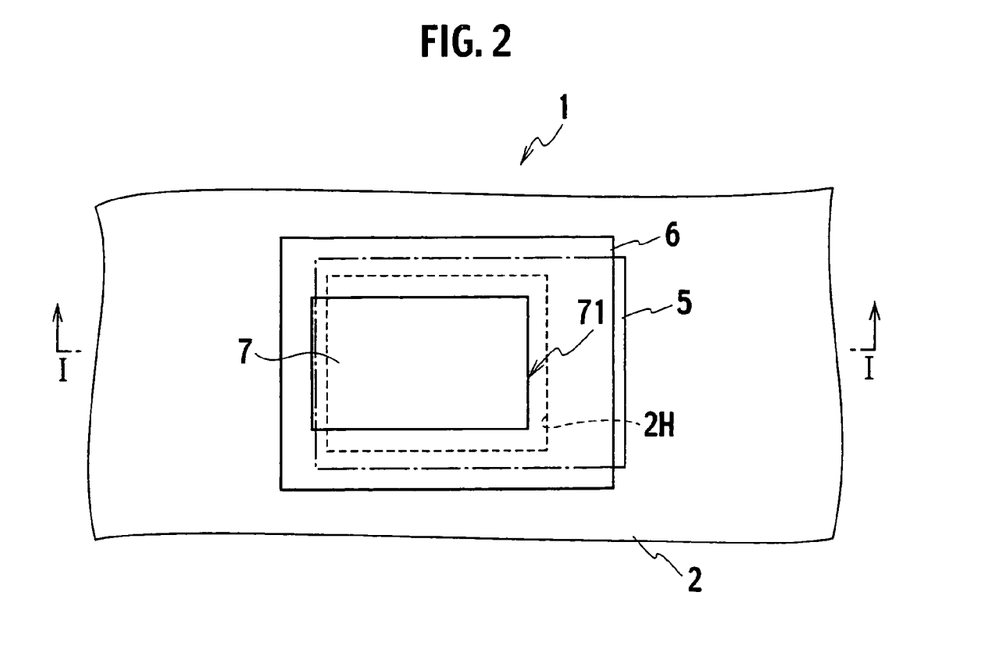
FIG. 2 is a top plan view of the thin film piezoelectric resonator of FIG. 1.
Figure 3:
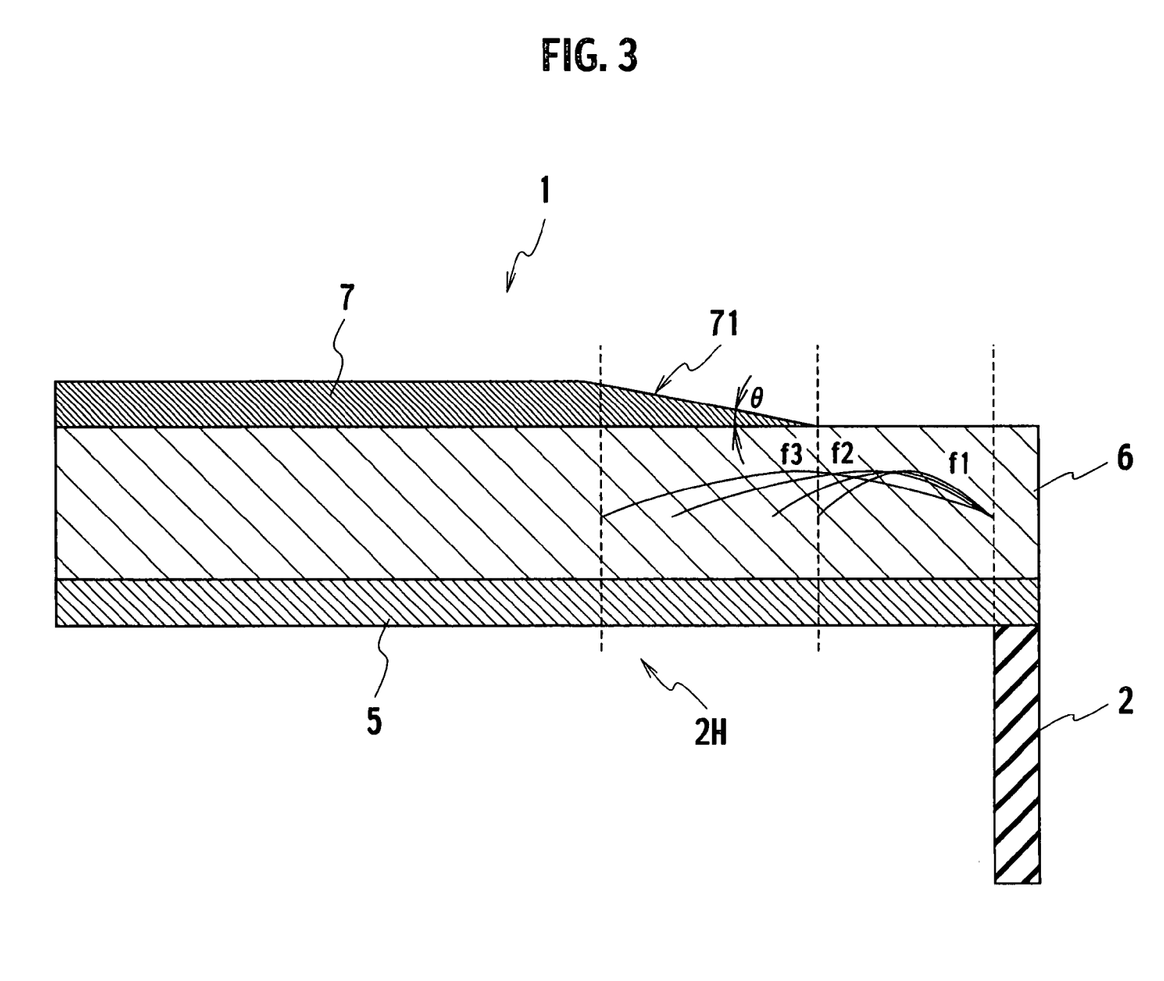
FIG. 3 is an enlarged cross section of an essential part of the thin film piezoelectric resonator of FIG. 1.

Referring to FIG. 1 to FIG. 3, a thin film piezoelectric resonator 1 (called the "piezoelectric resonator 1") in this embodiment includes a substrate 2 having a cavity 2H; a first electrode (lower electrode) 5 extending over the cavity 2H; a piezoelectric film 6 extending on first electrode 5; and a second electrode 7 extending partly on the piezoelectric film 6. A periphery 71 of the second electrode 7 overlaps on the cavity 2H, and is tapered to have an inner angle θ of 30 degrees or smaller defined by a part of the periphery thereof and a bottom thereof, e.g., the inner angle θ is set between 15 degrees and 30 degrees in the first embodiment.

The substrate 2 is made of silicon in this embodiment. The cavity 2H is in the shape of a rectangle, for example. When an acoustic reflector is used, it is placed in the cavity 2H, which is made by digging a part of the substrate 2.

The first electrode 5 extends over the cavity 2H and on the substrate 2. A part of the first electrode 5 which does not extends over the cavity 2H and is present on the substrate 2 functions as an outgoing line. The first electrode 5 is mainly made of an aluminum (Al) film or an aluminum alloy film, for example, and has a dual structure, i.e., a lower part of the first electrode 5 has the amorphous structure in order to improve the orientation of the piezoelectric film 6.

The piezoelectric film 6 is placed on the first electrode 5, and extends above the cavity 2H. The piezoelectric film 6 is preferably made of aluminum nitride (AlN), for example.

The second electrode 7 extends on the piezoelectric film 6 and above the cavity 2H. A part of the second electrode 7 which does not extend above the cavity 2H functions as an outgoing line on the piezoelectric film 6. The second electrode 7 is preferably made of molybdenum (Mo).

In the piezoelectric resonator 1, the first electrode 5, piezoelectric film 6 and second electrode 7 which bridges over the cavity 2H serve as an exciter. The exciter can be vibrated by applying a voltage across the first and second electrodes 5 and 7, so that the piezoelectric resonator 1 can have resonating characteristics.

A first wiring 8A extends over the substrate 2 but not over the cavity 2H, is electrically connected to the first electrode 5 via a dummy pad 3, and is preferably made of Mo, for example. A second wiring 8B extends over the substrate 2 but not over the cavity 2H, is electrically connected to the second electrode 7.

The dummy pad 3 is conductive, has etching selectivity to the first and second electrodes 5 and 6, and is placed where a lead wiring of the first electrode 5 (the lead wiring being flush with the first electrode 5) and the periphery of the piezoelectric film 6 are present. The dummy pad 3 is structured as a link-up wiring, enables the patterning of the piezoelectric film 6, prevents the disconnection of the lead wiring (first electrode 5) and the first wiring 8A, and assures the electric connection between the lead wiring and the first wiring 8A. The dummy pad 3 is preferably made of Mo, for example. The dummy pad 3 preferably has an inner angle between 30 degrees and 60 degrees in order to improve step coverage of the first wiring 8A on the dummy pad 3.

[Characteristics of Piezoelectric Resonator]

Figure 4:
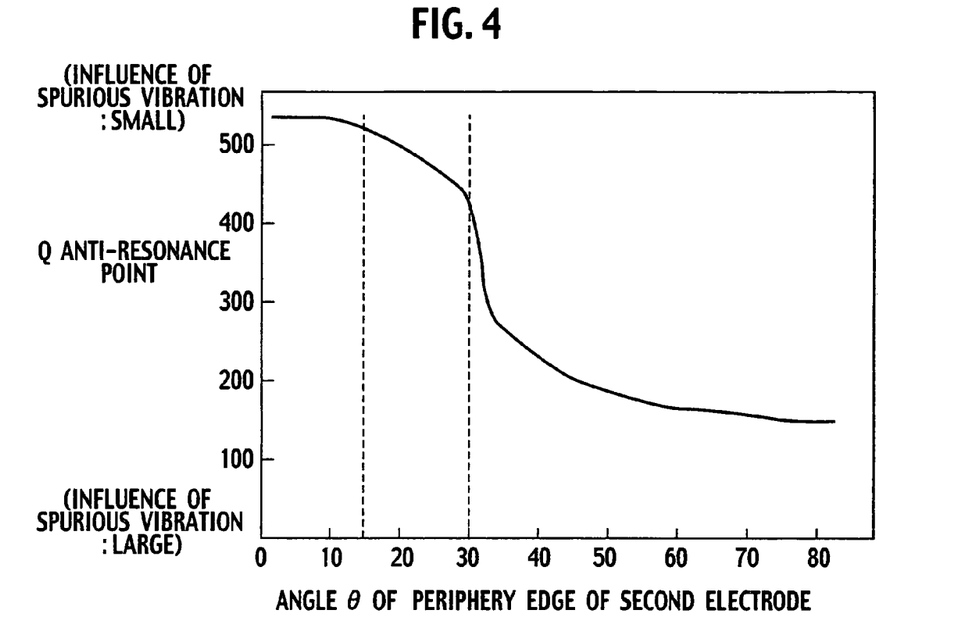
FIG. 4 shows the relationship between an angle of an edge of a second electrode in the thin film piezoelectric resonator of FIG. 3 and an anti-resonance point.

FIG. 3 is an enlarged cross section of an essential part of the thin film piezoelectric resonator of FIG. 1, and FIG. 4 shows the relationship between an angle of an edge of a second electrode in the thin film piezoelectric resonator of FIG. 3 and an anti-resonance point.

In the first embodiment, the piezoelectric resonator 1 alleviates environmental conditions by controlling the edge of the second electrode 7 as a stationary end, and efficiently dispersing frequencies of standing waves, which suppresses spurious vibrations. Although it is impossible to completely remove standing waves, it is possible to extensively reduce the spurious vibrations in the Smith chart.

Referring to FIG. 3, the length of the mildly tapered edge 71 of the second electrode 7 is very important, and should be as long as bulk waves of the piezoelectric film 6. For this purpose, the inner angle $\theta$ of the edge of the second electrode 7 should be 30 degrees or smaller taking a processing margin into consideration.

Further, when the inner angle $\theta$ is 30 degrees or less and is being gradually reduced below 30 degrees, the anti-resonance point is abruptly raised. Refer to FIG. 4. The higher the anti-resonance point, the less the spurious vibrations. On the other hand, since errors of processing precision of the edge 71 of the second electrode 7 are increased during fabricating, it not preferable that the inner angle $\theta$ is 5 degrees or smaller. Therefore, the inner angle $\theta$ is 15 degrees or larger which is not practically problematic in view of the processing precision.

Figure 5:
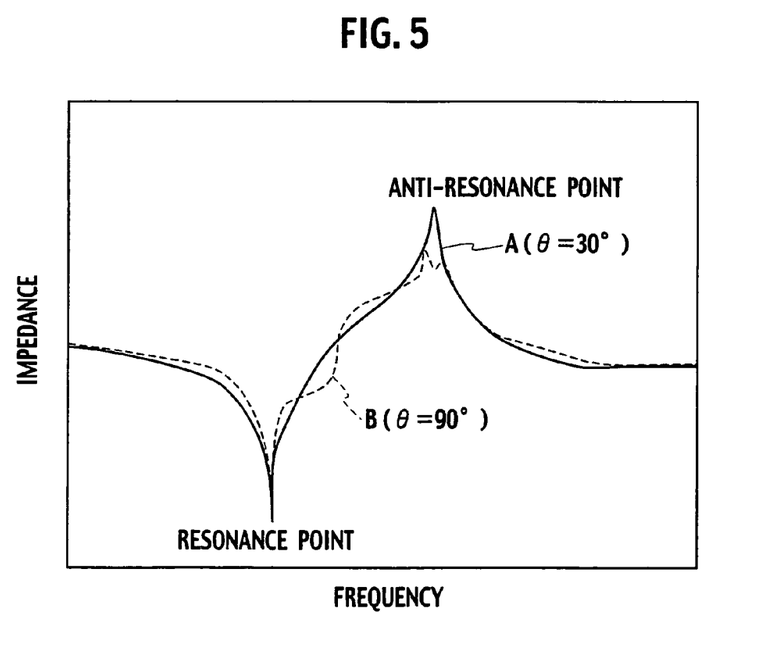
FIG. 5 shows high frequency characteristics of the thin film piezoelectric resonator of FIG. 3.

The piezoelectric resonator 1 has frequency characteristics as shown in FIG. 5. In FIG. 5, the abscissa represents frequencies while the ordinate represents the impedance. The letter "B" denotes frequency characteristics when the edge of the second electrode 7 is worked to be vertical ($\theta$=90 degrees). In this case, the high frequency characteristics include remarkable spurious vibrations. On the other hand, the letter "A" denotes frequency characteristics when the edge of the second electrode 7 is worked to have the inner angle $\theta$ of 30 degrees or smaller. The frequency characteristics do not include the spurious vibrations.

[Method of Manufacturing Piezoelectric Resonator]

The piezoelectric resonator 1 is manufactured as shown in FIG. 6 to FIG. 9. First of all, the substrate is prepared. The Si subject is preferably used.

Figure 6:
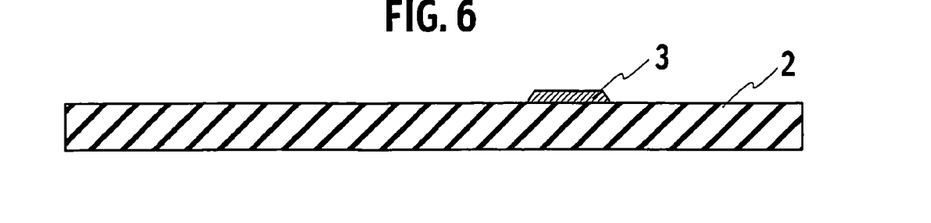

Referring to FIG. 6, the dummy pad 3 is formed on the substrate 2 (the upper surface in FIG. 6), at a position where the lead wiring of the first electrode 5 and the periphery of the piezoelectric film 6 overlap. The dummy pad 3 is made of an Mo film prepared by the sputtering process. The Mo film is patterned using a mask prepared by the photolithography process.

Figure 7:
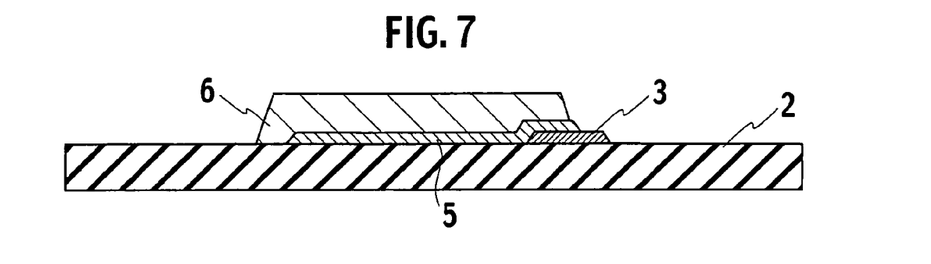
FIG. 7 is a cross section showing how the thin film piezoelectric resonator is made in a second manufacturing process.

Thereafter, a first electrode forming layer and a piezoelectric film forming layer are made in succession on the substrate 2 including the dummy pad 3 in a high vacuum system (refer to FIG. 7). In accordance with the frequency of the W-DMA specification, a 250 nm—thick Al alloy film is used for the first electrode forming layer. A 1700 nm—thick AlN film is used for the piezoelectric film forming layer.

Referring to FIG. 7, the piezoelectric film forming layer is patterned, thereby completing the piezoelectric film 6. Then, the first electrode forming layer is patterned, completing the first electrode 5. The patterning is conducted by the reactive dry etching process in which chlorine (Cl) is used, and by using masks prepared by the photolithography process.

Figure 8:
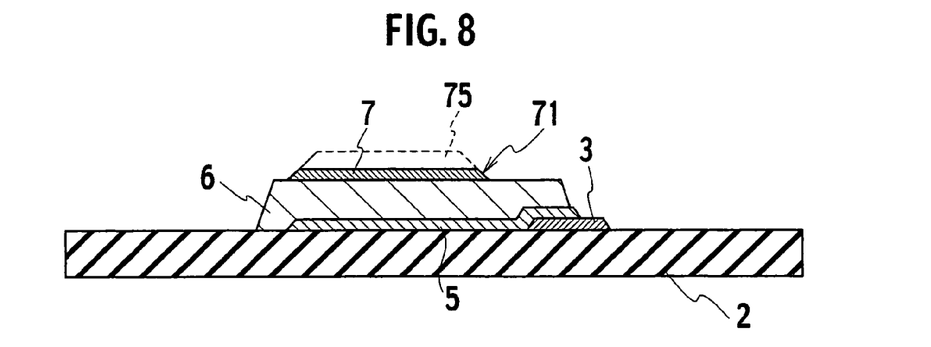
FIG. 8 is a cross section showing how the thin film piezoelectric resonator is made in a third manufacturing process.

Next, a second electrode forming layer is formed all over the substrate 2 including the piezoelectric film 6 (refer to FIG. 8). A sputtered Mo film having the thickness of 250 nm is used as the second electrode forming layer. Thereafter, a photo-resist film is formed on the second electrode forming layer at a proposed position of the second electrode 7 and the lead wiring. The photolithography process is used in this case. The photo-resist film is baked for approximately 10 minutes to 20 minutes at a temperature of 150° C. A mask (etching mask) 75 shown by a broken line in FIG. 8 is made using the photo-resist film. An edge of the mask 75 is tapered similarly to the edge 71 of the second electrode 7 since the mask 75 is baked. In short, the inner angle $\theta$ is preferably between 15 degrees and 30 degrees.

The second electrode forming layer is patterned using the mask 75, thereby completing the second electrode 7. The tapered edge of the mask 75 is copied onto the edge 71 of the second electrode 7, so that the inner angle $\theta$ of the edge 71 is made within the foregoing range. The mask 75 is then removed.

Figure 9:
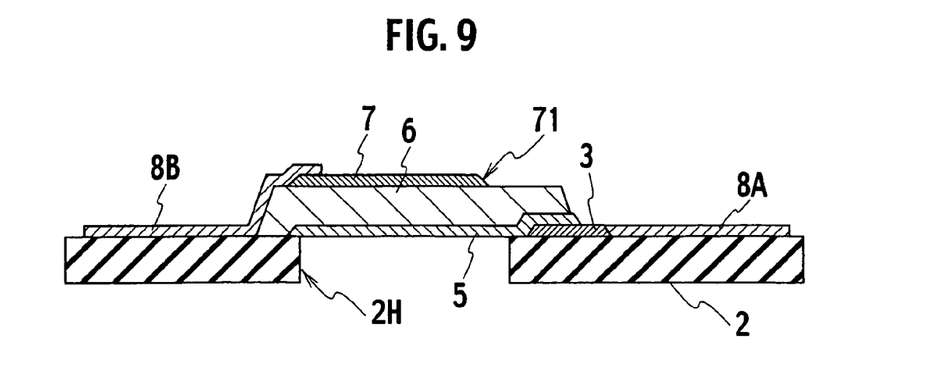
FIG. 9 is a cross section showing how the thin film piezoelectric resonator is made in a fourth manufacturing process.

The first wiring 8A (which is electrically connected to the first electrode 5 via the dummy pad 3) and the second wiring 8B (which is connected to the second electrode 7) are made in succession in the same manufacturing step (refer to FIG. 9).

Thereafter, the substrate 2 has its rear surface etched toward its front surface, thereby making the cavity 2H. In this state, the piezoelectric resonator 1 of the first embodiment is completed.

EXAMPLE

A specific example of the piezoelectric resonator 1 of the first embodiment will be described with reference to FIG. 1 to FIG. 3.

In the piezoelectric resonator 1, the first electrode 5 has a dual structure in which the lower part thereof is amorphous in order to improve the orientation of the piezoelectric film 6, i.e., AlN. Resonance characteristics can be improved by controlling the orientation of AlN. The orientation of the sputtered AlN film is controlled to be 1.5 degrees or less with respect to the rocking curve of X rays. Further, the stress of AlN is also controlled in order to stabilize the components bridging the cavity 2H. Specifically, the substrate 2 is subject to the high speed RIE from its rear surface in order to make the cavity 2H. The first and second wirings 8A and 8B are made of gold (Au) or Al.

The piezoelectric resonator 1 operates on a 2 GHz band, has an electrical-mechanical coupling constant of 6.7%, and a resonance Q value of 800. During the manufacturing process, an in-plane distribution of Si wafer is excellent, and the foregoing characteristics can be reliably reproduced on a 6-inch wafer.

As described above, in the piezoelectric resonator 1, the edge 71 of the second electrode 7 is tapered to have the inner angle θ of between 15 degrees and 30 degrees, which prevents the second electrode 7 from having the irregular polygonal shape, improves the resonance characteristics, and accomplish the downsizing.

Further, with the manufacturing method of the piezoelectric resonator 1, the photo-resist film which is on the second electrode 7 and overlaps on the cavity 2H is made, so that the mask 75 is formed by tapering the edge of the photo-resist film in order to make the inner angle acute. The second electrode forming layer is patterned using the mask 75, thereby making the second electrode 7. The tapered edge of the mask 75 is copied onto the edge of the second electrode 7. The inner angle θ of the edge of the second electrode 7 is between 15 degrees and 30 degrees. The edge of the mask 75 is only baked after the photo-resist film is patterned. Therefore, it is not necessary to make a new damper layer, which is effective in reducing the number of manufacturing steps and improving the manufacturing yield.

Second Embodiment

A second embodiment is intended to promote the suppression of the spurious vibrations in the piezoelectric resonator of the first embodiment, and to provide a piezoelectric resonator which is reliable for a long period of time.

Figure 10:
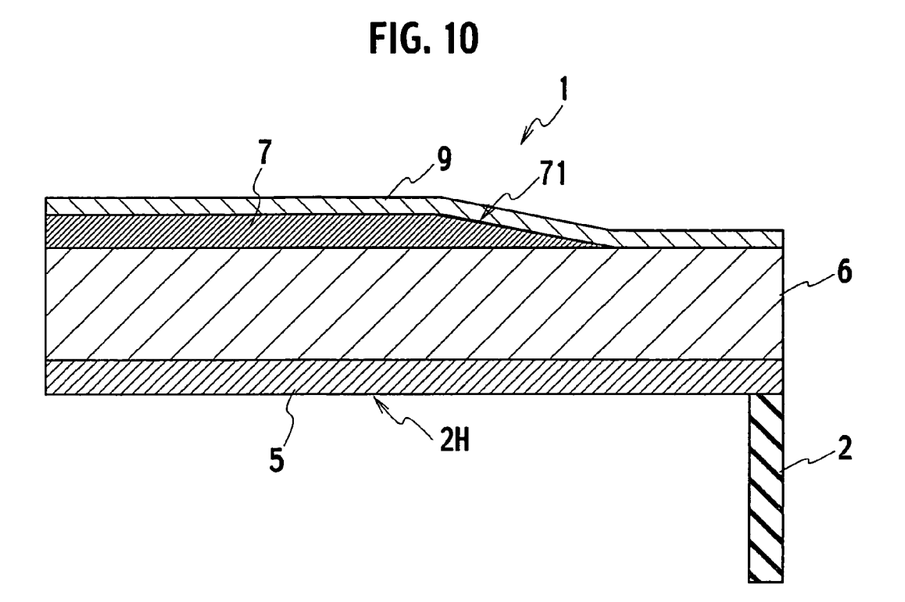
FIG. 10 is an enlarged cross section of an essential part of a thin film piezoelectric resonator according to a second embodiment.

Referring to FIG. 10, the piezoelectric resonator 1 of this embodiment includes an insulator (passivation film) 9 which has a dielectric constant different from that of the second electrode 7, and uniform thickness. The insulator 9 extends over the second electrode 7 including the edge 71, and the piezoelectric film 6. In short, the insulator 9 is in direct contact with the second electrode 7. The insulator 9 is preferably made of a silicon-nitride film ($Si_3N_4$) which is prepared by the CVD process and is approximately 2 nm to 50 nm thick. Alternatively, the insulator 9 may be made of a silicon-oxide film ($SiO_2$), an AlN film and so on which have dielectric constants different from that of the second electrode 7. Further, the insulator 9 may be prepared by the sputtering process or by using an electron gun (E gun) so long as the stepped part is sufficiently covered and the film stress is allowable.

The insulator 9 protects the second electrode 7, piezoelectric film 6 and so on of the piezoelectric resonator 1 against the aging caused by the oxidization. Specifically, the insulator 9 extends over the second electrode 7 and the piezoelectric film 6, and prevents them from being exposed to the air. Therefore, frequencies of standing waves can be effectively dispersed, which more extensively suppresses spurious vibrations. The insulator 9 is formed on the second electrode 7 and the piezoelectric film 6, and does not need any process such as the patterning, which improves the processing margin in the manufacturing process.

Third Embodiment

Figure 11:
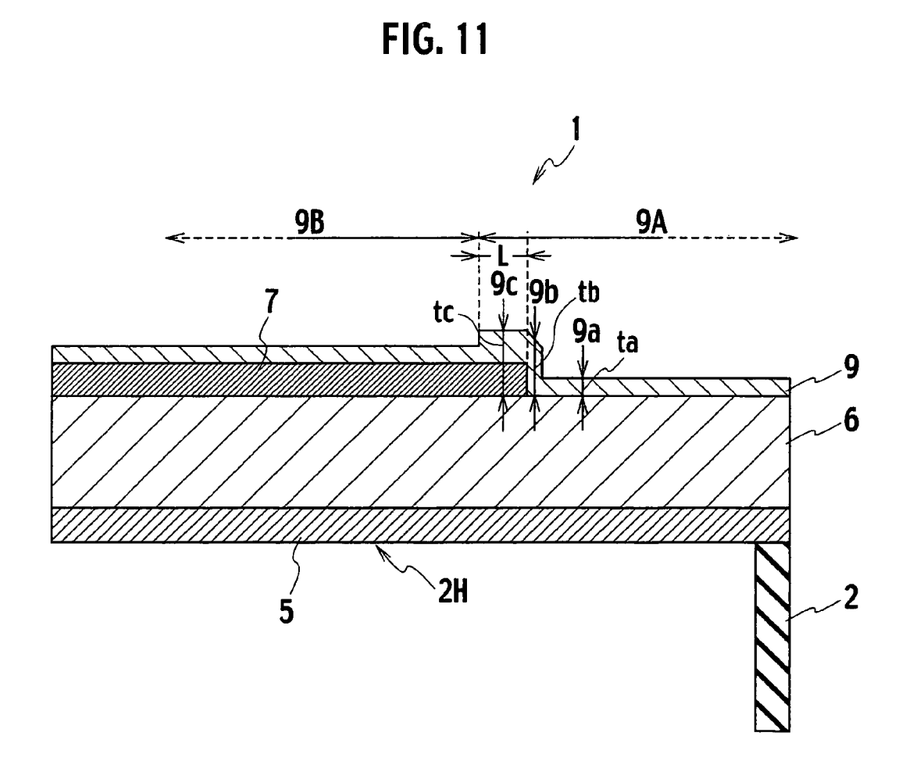
FIG. 11 is an enlarged cross section of an essential part of a thin film piezoelectric resonator according to a third embodiment.

In a third embodiment, the cross sectional shape of the edge 71 of the second electrode 7 and the shape of the insulator 9 of the second embodiment are modified. The insulator 9 extends over the second electrode 7.

Referring to FIG. 11, a piezoelectric resonator 1 includes a substrate 2 having a cavity 2H; a first electrode 5 extending over the cavity 2H; a second electrode 7 whose edge 71 overlaps on the cavity 2H; a piezoelectric film 6; and an insulator 9. The insulator 9 extends over the second electrode 7 and a part of the piezoelectric film 6. The insulator 9 is thin on the center of the second electrode 7, and is thick on the periphery of the second electrode 7.

The cross sectional shape of the edge 71 of the second electrode 7 of this embodiment differs from the cross sectional shapes of the edges 71 of the second electrodes 7 in the first and second embodiments. In this embodiment, the edge 71 has the inner angle θ is approximately 90 degrees.

The insulator 9 includes a first insulating element 9A and a second insulating element 9B. The first insulating element 9A extends over the piezoelectric film 6 and the periphery of the second electrode 7, and is thick on the edge of the second electrode 7. The second insulating element 9B extends over the center of the second electrode 7 and is thin thereon. The first and second insulating elements 9A and 9B are made in the same manufacturing step by partially etching an insulating film (i.e., on the center of the second electrode 7).

The thickness of the first insulating element 9A varies on the piezoelectric film 6 (a point 9a) [extending over the cavity 2H], at a border (a point 9b) between the piezoelectric film 6 and the second electrode 7, and at the periphery (a point 9c) of the second electrode 7. In other words, effective thicknesses ta, tb and tc of the first insulating element 9A are increased at the points 9a, 9b and 9c. The insulator 9 seems to be thickened because the thickness of the second electrode 7 is added at the points 9b and 9c. By accurately positioning the edge 71 of the second electrode 7 and determining the positions where the second insulating element 9A changes its thickness, it is possible to effectively disperse the frequencies of standing waves and suppress spurious vibrations. The suppression of the spurious vibrations extensively depends upon the border between the first and second insulating elements 9A and 9B.

Figure 12:
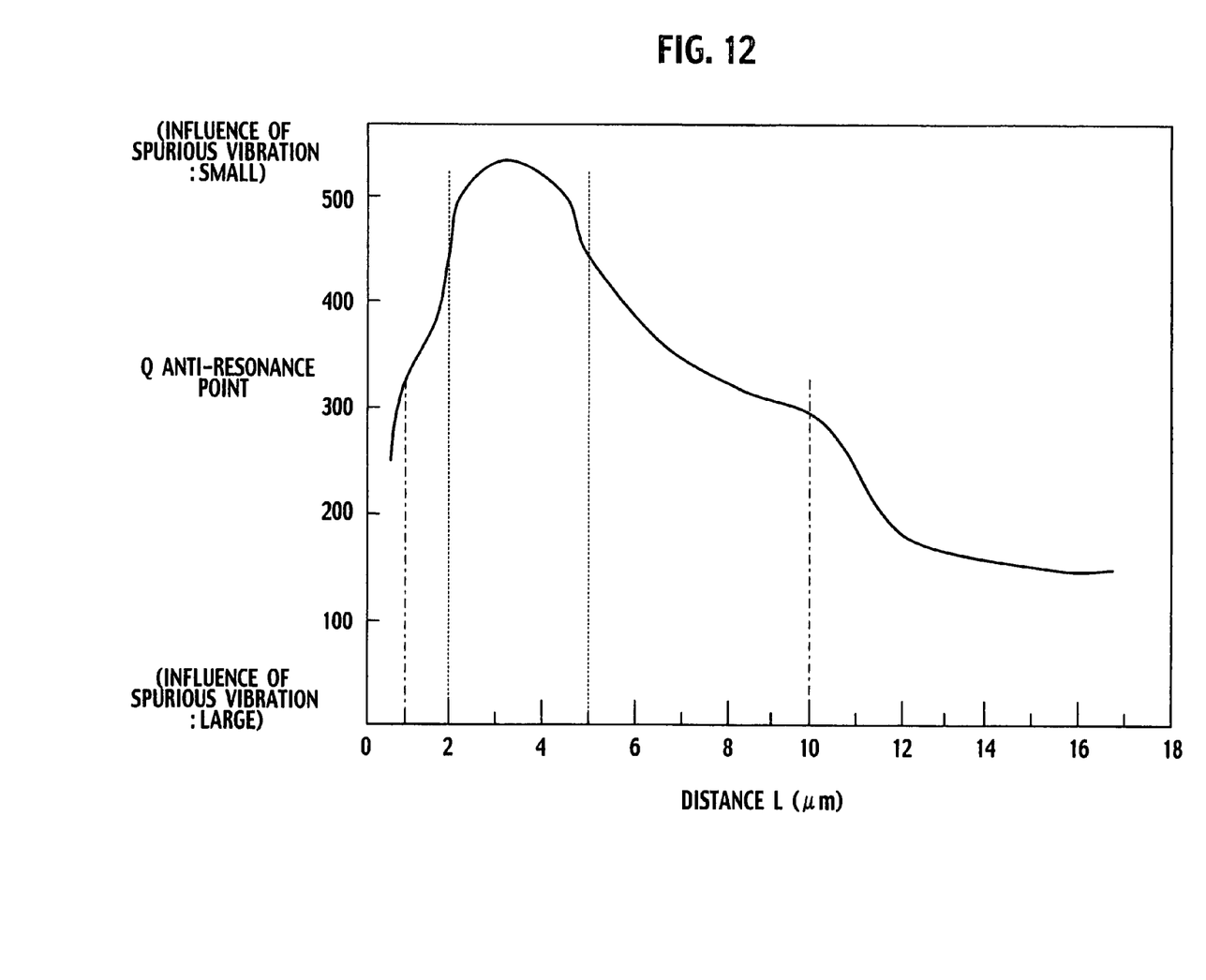
FIG. 12 shows the relationship between a distance between an edge of a second electrode and a stepped portion of an insulator and an anti-resonance point of the thin film piezoelectric resonator of FIG. 13.

FIG. 12 shows the relationship between an anti-resonance point and a distance L from the 1 edge 71 of the second electrode 7 to the border of the first and second insulating elements 9A and 9B. In FIG. 12, the abscissa denotes the distance L while the ordinate denotes the anti-resonance point. When the second insulating element 9A is positioned in a range (within the distance L) of 1 μm to 10 μm, the anti-resonance point is increased while spurious vibrations are suppressed. Especially, when the distance L is 2 μm to 5 μm, spurious vibrations are most suppressed. The inventors have conducted experiments, and have noted that spurious vibrations are most extensively suppressed when the distance L is 3 μm.

Fourth Embodiment

In this embodiment, a thin film piezoelectric resonator 1 is a combination of the thin film piezoelectric resonators 1 of the second and third embodiments.

Figure 13:
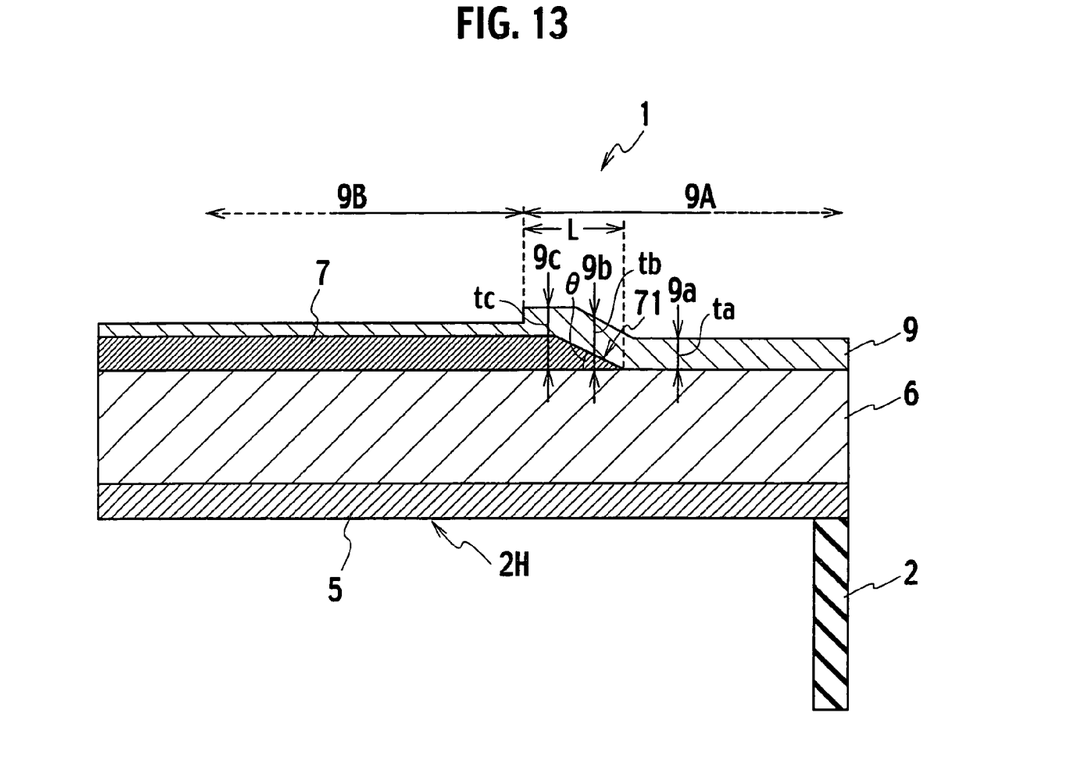
FIG. 13 is an enlarged cross section of an essential part of a thin film piezoelectric resonator according to a fourth embodiment.

Referring to FIG. 13, the piezoelectric resonator 1 includes a substrate 2 having a cavity 2H, a first electrode 5 spanning over the cavity 2H, a piezoelectric film 6 on the first electrode 5, a second electrode 7, and an insulator 9. The second electrode 7 has a periphery 71 which overlaps over the cavity 2H, and is tapered by the angle θ of 30 degrees or smaller. The insulator 9 extends over the second electrode 7 and the piezoelectric film 6, and is thicker on the piezoelectric film 6 and the periphery of 71 of the second electrode than on the second electrode 7. Specifically, the insulator 9 has the thickness gradually varying on the piezoelectric film 6 and the second electrode 7.

The piezoelectric resonator 1 of this embodiment is as advantageous and effective as those of the second and third embodiments when they are combined.

Other Embodiments

Although the invention has been described with respect to some embodiments thereof, it will not be understood by those skilled in the art that various other modifications are possible. In the foregoing embodiments, the thin film piezoelectric resonators are described to be applied to the frequency band of 2 GHz. Alternatively, the invention is applicable to piezoelectric resonators operating on frequency bands of 800 MHz to 5 GHz.

The foregoing descriptions relate to the thin film piezoelectric resonators which are used to constitute filters. Alternatively, the invention is applicable to constituting voltage-controlled oscillators.

Still further, the piezoelectric resonator is assumed to have the FBAR structure. Alternatively, the piezoelectric resonator may have the SMR (Surface-mounted Resonator) structure having a sound reflecting layer.

As described so far, the present invention provides the thin film piezoelectric resonator which can not only improve resonating characteristics but also can be downsized.

Further, the present invention provides the method of manufacturing the thin film piezoelectric resonator. The method improves the yield and assures sufficient processing margins while reducing the number of manufacturing steps.

CROSS REFERENCE TO RELATED APPLICATION

This application is based upon and claims the benefit of priority from the prior Japanese Patent Application No. 2005-229,815 filed on Aug. 8, 2005, the entire contents of which are incorporated by reference.

The invention claimed is:

1. A thin film piezoelectric resonator comprising:
   a substrate having a cavity;
   a first electrode extending over the cavity;
   a piezoelectric film placed on the first electrode; and
   a second electrode placed on the piezoelectric film, the second electrode having a part of a periphery which overlaps on the cavity and is tapered, the second electrode having an inner angle of 30 degrees or smaller defined by a part of the periphery thereof and a bottom thereof.

2. The thin film piezoelectric resonator of claim 1, wherein the part of the periphery of the second electrode is tapered and has an inner angle of 15 degrees or larger.

3. The thin film piezoelectric resonator of claim 1, wherein the cavity goes through the substrate.

4. The thin film piezoelectric resonator of claim 1, wherein the cavity includes an acoustic reflecting layer embedded therein.

5. The thin film piezoelectric resonator of claim 1, further comprising an insulator which extends over the second electrode including the periphery thereof and the piezoelectric film where the second electrode is absent, and has a dielectric constant different from a dielectric constant of the second electrode.

6. The thin film piezoelectric resonator of claim 1, wherein the insulator is made of a silicon oxide film, a silicon nitride film or an aluminum nitride film.

7. The thin film piezoelectric resonator of claim 2, further comprising an insulator which extends over the second electrode including the periphery thereof and the piezoelectric film where the second electrode is absent, and has a dielectric constant different from a dielectric constant of the second electrode.

8. The thin film piezoelectric resonator of claim 2, wherein the insulator is made of a silicon oxide film, a silicon nitride film or an aluminum nitride film.

9. A thin film piezoelectric resonator comprising:
   a substrate having a cavity;
   a first electrode extending over the cavity;
   a piezoelectric film placed on the first electrode;
   a second electrode placed on the piezoelectric film and having a part of a periphery thereof which overlaps on the cavity, and
   an insulator placed on the second electrode and the piezoelectric film where the second electrode is absent, and being thin on the center of the second electrode and thick on the periphery of the second electrode.

10. The thin film piezoelectric resonator of claim 9, wherein the insulator is thick in a range of 1 μm to 10 μm on the periphery of the second electrode, and is thin on the remaining part of the second electrode.

11. The thin film piezoelectric resonator of claim 9, wherein the insulator is thick in a range of 2 μm to 5 μm on the periphery of the second electrode, and is thin at the remaining part of the second electrode.

12. The thin film piezoelectric resonator of claim 9, wherein the insulator is made of a silicon oxide film, a silicon nitride film or an aluminum nitride film.

13. The thin film piezoelectric resonator of claim 9, wherein an acoustic reflecting layer is embedded in the cavity.

14. A thin film piezoelectric resonator comprising:
   a substrate having a cavity;
   a first electrode extending over the cavity;
   a piezoelectric film placed on the first electrode;
   a second electrode placed on the piezoelectric film and having a part of a periphery which overlaps on the cavity, is tapered, and has an inner angle of 30 degrees or smaller defined by a part of the periphery thereof and a bottom thereof; and
   an insulator placed on the second electrode and the piezoelectric film where the second electrode is absent, and being thin on the center of the second electrode and thick on the periphery of the second electrode.

15. The thin film piezoelectric resonator of claim 14, wherein the periphery of the second electrode is tapered and has an inner angle of 15 degrees or larger.

16. A thin film piezoelectric resonator comprising:
- a substrate having a cavity;
- a first electrode extending over the cavity;
- a piezoelectric film placed on the first electrode;
- a second electrode placed on the piezoelectric film and having a periphery which overlaps on the cavity, and
- an insulator placed on the second electrode and the piezoelectric film where the second electrode is absent, and having the thickness varying on the piezoelectric film and on the periphery of the second electrode.

* * * * *

UNITED STATES PATENT AND TRADEMARK OFFICE
CERTIFICATE OF CORRECTION

PATENT NO. : 7,709,999 B2  Page 1 of 1
APPLICATION NO. : 10/582229
DATED : May 4, 2010
INVENTOR(S) : Itaya et al.

It is certified that error appears in the above-identified patent and that said Letters Patent is hereby corrected as shown below:

On the title page, item (86) should read:
-- PCT No.: PCT/JP2006/307155

§371 (c)(1),
(2), (4) Date: Jun. 9, 2006 --

Signed and Sealed this

Sixth Day of July, 2010

David J. Kappos
*Director of the United States Patent and Trademark Office*